United States Patent
Zhan

(10) Patent No.: US 8,279,947 B2
(45) Date of Patent: Oct. 2, 2012

(54) METHOD, APPARATUS AND SYSTEM FOR MULTIPLE-DESCRIPTION CODING AND DECODING

(75) Inventor: Wuzhou Zhan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 371 days.

(21) Appl. No.: 12/633,908

(22) Filed: Dec. 9, 2009

(65) Prior Publication Data

US 2010/0091901 A1 Apr. 15, 2010

Related U.S. Application Data

(63) Continuation of application No. PCT/CN2008/071533, filed on Jul. 3, 2008.

(30) Foreign Application Priority Data

Jul. 5, 2007 (CN) .......................... 2007 1 0128408

(51) Int. Cl.
*H04B 14/04* (2006.01)
(52) U.S. Cl. ................... 375/242; 375/240.03; 375/245; 375/316; 375/340; 382/451
(58) Field of Classification Search .................. 375/242, 375/245, 316, 340, 240.03; 382/451
See application file for complete search history.

(56) References Cited

U.S. PATENT DOCUMENTS

| | | | |
|---|---|---|---|
| 6,253,185 B1 | 6/2001 | Arean et al. | |
| 6,345,125 B2 * | 2/2002 | Goyal et al. | 382/251 |
| 6,460,153 B1 | 10/2002 | Chou et al. | |
| 6,556,624 B1 | 4/2003 | Orchard et al. | |
| 6,823,018 B1 | 11/2004 | Jafarkhani et al. | |

(Continued)

FOREIGN PATENT DOCUMENTS

CN 1742436 A 3/2006

(Continued)

OTHER PUBLICATIONS

Written Opinion of the International Searching Authority (translation) dated (mailed) Oct. 23, 2008, issued in related application No. PCT/CN2008/071533, filed Jul. 3, 2008, Huawei Technologies Co. Ltd.

(Continued)

*Primary Examiner* — Ted Wang
(74) *Attorney, Agent, or Firm* — Finnegan, Henderson, Farabow, Garrett & Dunner LLP

(57) ABSTRACT

A method, apparatus and system for multiple-description coding (MDC) and multiple-description decoding (MDD) are provided in the present invention. The MDC method comprises the following steps: receiving signals, processing the signal according to the first multiple-description method to generate at least two first description signals, processing at least one of the first description signals through the second multiple-description method to generate at least two second description signals, and coding the second description signal to generate the multiple-description bit stream. The MDD method comprises the following steps: receiving the multiple-description bit stream, decoding the multiple-description bit stream to generate the second description signal, processing the second description signal through the second multiple-description inverse transformation method to generate the first description signal, processing the first description signal through the first multiple-description inverse transformation method to generate the reconstruction signal. This invention simplifies the MDC and MDD, and distributes the voice quality deteriorations to different parts, thus improving user experience.

4 Claims, 9 Drawing Sheets

U.S. PATENT DOCUMENTS

| | | | |
|---|---|---|---|
| 6,920,177 | B2 | 7/2005 | Orchard et al. |
| 7,061,404 | B2 | 6/2006 | Irvine et al. |
| 7,222,285 | B2 | 5/2007 | Chou et al. |
| 7,289,565 | B1 | 10/2007 | Jafarkhani et al. |
| 2003/0138047 | A1 | 7/2003 | Orchard et al. |
| 2004/0141091 | A1 | 7/2004 | Irvine et al. |
| 2004/0141656 | A1 | 7/2004 | Irvine et al. |
| 2005/0152456 | A1 | 7/2005 | Orchard et al. |
| 2005/0210356 | A1 | 9/2005 | Chou et al. |
| 2006/0015792 | A1 | 1/2006 | Vitali et al. |
| 2006/0197691 | A1 | 9/2006 | Irvine et al. |
| 2007/0204203 | A1 | 8/2007 | Chou et al. |

FOREIGN PATENT DOCUMENTS

| | | | |
|---|---|---|---|
| KR | 20040027219 A | 4/2004 | |

OTHER PUBLICATIONS

First Office Action of the State Intellectual Property Office of the PRC dated Aug. 23, 2010 for Application No. 200710128408.7, Huawei Technologies Co. Ltd., 8 pgs.

Communication from the EPO pursuant to Rule 62 EPC, Extended European Search report issued Apr. 22, 2010 for Application No. 08773094.1, Huawei Technologies Co. Ltd., 10 pgs.

Jiang, W. et al., "Multiple Description Coding via Polyphase Transform and Selective Quantization", IS&T/SPIE Conference on Visual Communications and Image Processing '99, San Jose, California, SPIE vol. 3653, Jan. 1999, pp. 998-1008.

Batllo, J. et al., "Asymptotic Performance of Multiple Description Transform Codes", IEEE Transactions on Information Theory, vol. 43, No. 2, Mar. 1997, pp. 703-707.

Goyal, V. et al., "Generalized Multiple Description Coding With Correlating Transforms", IEEE Transactions on Information Theory, vol. 47, No. 6, Sep. 2001, pp. 2199-2224.

Schuller, G. et al., "Robust Low-Delay Audio Coding Using Multiple Descriptions", IEEE Transactions on Speech and Audio Processing, vol. 13, No. 5, Sep. 2005, pp. 1014-1024.

Arean, R. et al., "Multiple Description Perceptual Audio Coding with Correlating Transforms", IEEE Transactions on Speech and Audio Processing, vol. 8, No. 2, Mar. 2000, pp. 140-145.

Wang, Y. et al., "Multiple Description Coding Using Pairwise Correlating Transforms", IEEE Transactions on Image Processing, vol. 10, No. 3, Mar. 2001, pp. 351-366.

Goyal, Vivek, "Multiple Description Coding: Compression Meets the Network", IEEE Signal Processing Magazine, Sep. 2001, pp. 74-93.

Vaishampayan, Vinay A., "Design of Multiple Description Scalar Quantizers", IEEE Transactions on Information Theory, vol. 39, No. 3, May 1993, pp. 821-834.

Vaishampayan, V. et al., "Design of Entropy-Constrained Multiple-Description Scalar Quantizers", IEEE Transactions on Information Theory, vol. 40, No. 1, Jan. 1994, pp. 245-250.

Ozarow, L., "On a Source-Coding Problem with Two Channels and Three Receivers", American Telephone and Telegraph Company, The Bell System Technical Journal, vol. 59, No. 10, Dec. 1980, pp. 1909-1921.

\* cited by examiner

METHOD, APPARATUS AND SYSTEM FOR MULTIPLE-DESCRIPTION CODING AND DECODING

CROSS-REFERENCE TO RELATED APPLICATIONS

This application is a continuation of International Application Serial No. PCT/CN2008/071533, filed on Jul. 3, 2008, which claims priority to Chinese Patent Application Serial No. 200710128408.7, filed on Jul. 5, 2007, both of which are hereby incorporated by reference in their entireties.

FIELD OF THE INVENTION

This invention relates to the communications field, and in particular, to a method, apparatus and system for multiple-description coding and decoding.

BACKGROUND

Multiple-description coding (MDC) describes a source coding technology used for information transmission over an unreliable network. This technology generates at least one transmission bit stream and incorporates redundancy into each bit stream without additional delay, thus providing a source coding algorithm to prevent packet loss. The MDC technology represents source information through multiple descriptions, each of which describes the proximity of source information. When obtaining information from each other, a number of descriptions can generate the best proximity to the source information.

MDC is available in many methods, such as parity selection, dual transformation, and scalar quantization. 1. The multiple-description parity selection separates code parameters, namely, time domains or frequency domains, into odd numbers and even numbers in accordance with their indexes or natural orders, and then encodes those odd and even numbers. With different odd and even numbers, two irrelevant descriptions have no redundancy between them, and will not increase the overall coding rate. The multiple-description dual transformation maps the parameters, namely, time or frequency domains, into two descriptions through transform matrix. The dual transformation matrix can control the dependence between these two descriptions. Larger dependence causes more bits needed for coding and a higher coding rate. If one description is lost, the signal restored by another description provides higher quality. The multiple-description scalar quantization selects a scalar quantizer with smaller precision to quantize the parameters, namely, time or frequency domains. The higher precision causes greater dependence between two descriptions.

During Internet traffic peaks, the packet loss ratio reaches as high as 60%. The loss of one, two or even three packets accounts for a large percentage of total packet loss. The percentage varies according to Internet congestion. Higher congestion usually causes a larger packet loss. When the Internet is heavily congested, one-packet loss accounts for about 60% of the total loss, two-packet loss about 25%, and three-packet loss about 8%. Among various Internet multimedia applications, such as real-time video-audio communication and video on demand (VOD), both video and audio encoders must resist against three-packet loss to ensure video and voice quality. Two-description coding, however, can just resist against one-packet loss, and three-description coding against two-packet loss simultaneously. Therefore, the four-description coding is implemented to resist against three-packet loss.

In the prior art, four-description coding provides a single-type multiple-description method. For example, descriptions M1, M2, M3, and M4 have the same quantization precision and ¼ quantization interval between each two. If a multi-description decoder receives these descriptions and combines them through multiple-description decoding (MDD), this decoder can quadruple the quantization precision. Such precision, however, will be reduced if one or more descriptions are lost. Four-description coding involves 15 packet loss scenarios, including one for all four descriptions received, four for the loss of one description, six for the loss of two descriptions, and four for the loss of three descriptions. Therefore, decoding must be implemented for each of the 15 packet loss scenarios.

While studying and practicing the prior art, the inventor has identified the following drawbacks: If the packet loss rate reaches 50% and the lost quantization precision exceeds 50%, more quantization errors arise when decoding is performed through the received descriptions, thus degrading user experience.

SUMMARY

A method, apparatus and system for multiple-description coding and decoding is provided in the embodiment of the present invention to distribute voice quality deterioration across various aspects to improve user experience when packet loss takes place.

This invention approaches the above-mentioned technical problems through the following solution.

A multiple-description coding (MDC) method is provided in an embodiment of the present invention. The method includes:

receiving a signal and processing the received signal according to the first multiple-description method to generate at least two first description signals;

processing at least one of the first description signal according to the second multiple-description method to generate at least two second description signals; and coding the second description signal to generate a multiple-description bit stream.

A multiple-description decoding (MDD) method is provided in an embodiment of the present invention. The method includes:

receiving a multiple-description bit stream and decoding the multiple-description bit stream to generate a second description signal;

processing the second description signal according to the second multiple-description inverse transformation method to generate the first description signal; and processing the first description signal according to the first multiple-description inverse transformation method to generate a reconstruction signal.

An MDC apparatus is provided in an embodiment of the present invention. The apparatus includes:

a receiving unit, adapted to receive a signal;

a first multiple-description processing unit, adapted to process the received signal through the first multiple-description method to generate at least two first description signals;

a second multiple-description processing unit, adapted to process at least one of the first description signals through the second multiple-description method to generate at least two second description signals;

a coding unit, adapted to code the second description signal to generate multiple-description bit stream; and a receiving unit, adapted to receive the multiple-description bit stream.

An MDD apparatus is provided in an embodiment of the present invention. The apparatus includes:

a receiving unit, adapted to receive a multiple-description bit stream;

a decoding unit, adapted to decode the multiple-description bit stream to generate the second description signal;

a second multiple-description inverse transformation processing unit, adapted to process the second description signal through the second multiple-description inverse transformation method to generate the first description signal; and a first multiple-description inverse transformation processing unit, adapted to process the first description signal through the first multiple-description inverse transformation method to generate the reconstruction signal.

A MDC and MDD system is provided in an embodiment of the present invention. The system includes:

a coder, adapted to: process the received signal through the first multiple-description method to generate at least two first description signals; process at least one of the first description signals through the second multiple-description method to generate at least two second description signals; and code the second description signal to generate multiple-description bit stream; and deliver the multiple-description bit stream; and a decoder, adapted to: receive the multiple-description bit stream through a network; decode the multiple-description bit stream; process the decoded description signal through the second multiple-description inverse transformation method; and process the result obtained through the second multiple-description inverse transformation method through the first multiple-description inverse transformation method to generate a reconstruction signal.

A computer program product is provided in an embodiment of the present invention. This computer program product includes the code for the computer program. When the code is executed by a computer, it allows the computer to perform any step of the MDC method.

A readable memory medium for a computer is provided in an embodiment of the present invention. The readable memory medium for computer stores codes for computer programs. When the code is executed by a computer, it allows the computer to perform any step of the MDC method.

A computer program product is provided in an embodiment of the present invention. The computer program product includes the code for the computer program. When the code is executed by a computer, it allows the computer to perform any step of the MDD method.

A readable memory medium for the computer is provided in an embodiment of the present invention. The readable memory medium for computer stores codes for computer programs. When the code is executed by a computer, it allows the computer to perform any step of the MDD method.

The prior solution indicates that the coder processes the received signal through two multiple-description methods, while the decoder and receiver process the received signal through two multiple-description inverse transformation methods. Therefore, the coder and decoder simplify MDC and MDD through inverse processes. Because the voice quality deteriorations brought out through different multiple-description algorithms are distributed to different parts when packet loss takes place, user experience is greatly improved.

DETAILED DESCRIPTION

A method, apparatus and system for multiple-description coding and decoding is provided in an embodiment of the present invention. The following reference drawings and implementation examples further explain the present invention to illustrate the objectives, solutions, and advantages of the present invention.

Figure 1:
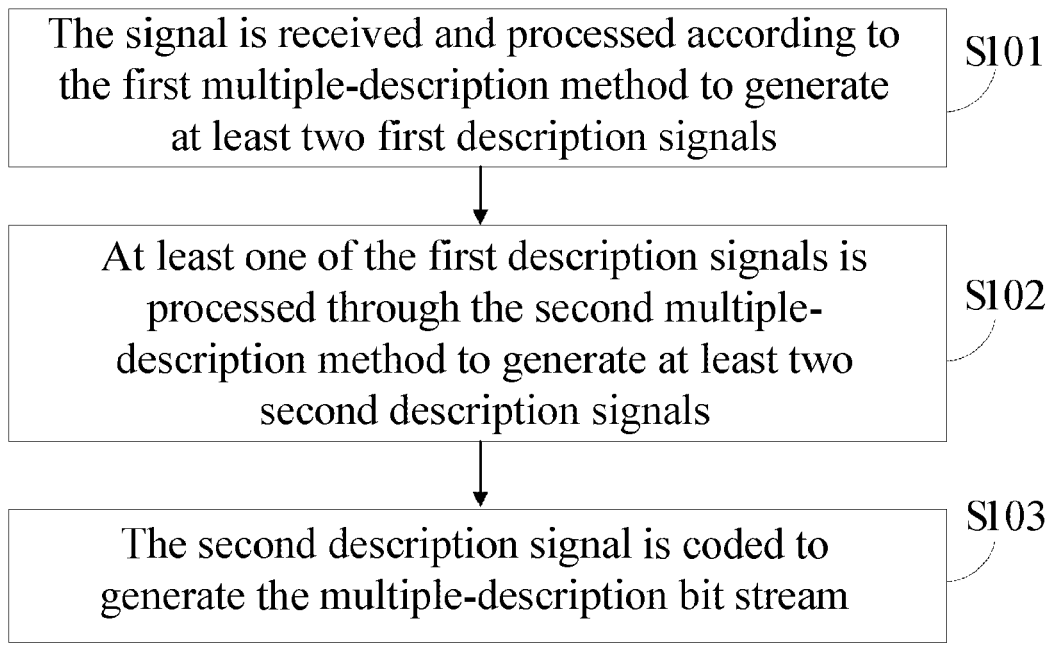
FIG. 1 shows a flowchart in an embodiment of the present invention.

FIG. 1 is a flowchart in an embodiment of the present invention:

S101: Signals are received, and processed through the first multiple-description method to generate at least two first description signals. For example, the first description signal is generated by multiple-description parity separation, dual transformation, or scalar quantization.

S102: At least one of the first description signals is processed through the second multiple-description method to generate at least two second description signals. For example, if the first multiple-description signal is generated by multiple-description parity separation or dual transformation, the second multiple-description is generated by multiple-description scalar quantization of the first description signal; if the first description signal is generated by multiple-description scalar quantization of the received signal, the second description signal is generated by multiple-description parity separation or dual transformation of the first description signal.

S103: The second description signal is coded to generate a multiple-description bit stream, where the signal is an audio signal, or a video signal, or a frequency domain parameter signal that is converted into a frequency domain; and the coding of the second description signal is: performing entropic coding on the second description signal.

The following examples illustrate an embodiment of the present invention:

Example 1 shows the first multiple-description method, namely, the multiple-description parity separation or multiple-description dual transformation, and the second multiple-description method, namely, the multiple-description scalar quantization.

Figure 2:
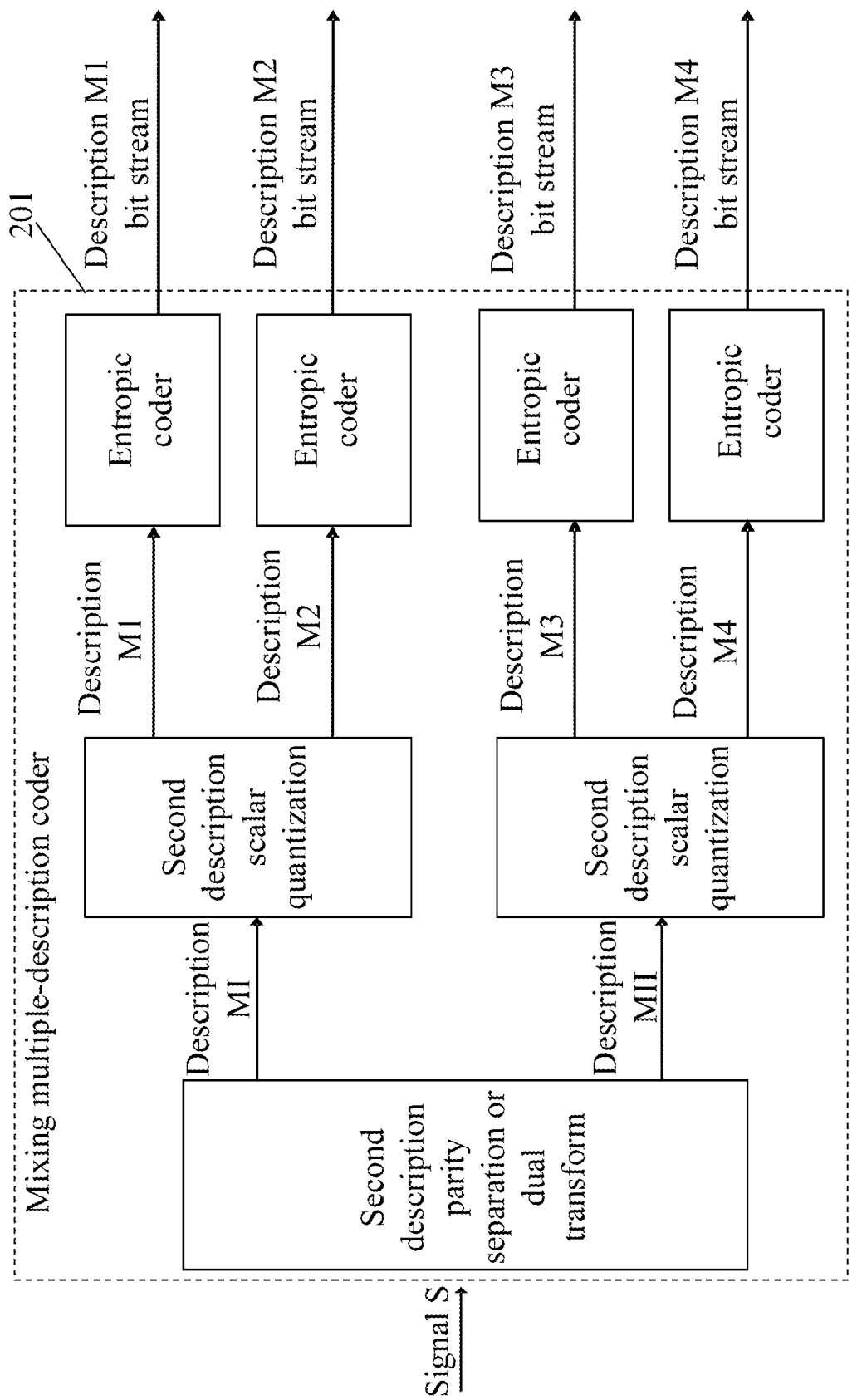
FIG. 2 is a flowchart in an embodiment of the present invention.

See FIG. 2. After coding the signal S, a mixing multiple-description coder 201 performs the two-description parity separation or dual transformation of signal S to generate descriptions MI and MII, implements the two-description scalar quantization of descriptions MI and MII to generate descriptions M1, M2, M3 and M4, and then entropically codes descriptions M1, M2, M3 and M4 through entropic coder, namely, Huffman code, to generate description M1 bit stream, description M2 bit stream, description M3 bit stream and description M4 bit stream.

The computing processes of parity separation, dual transformation, and scalar quantization are detailed as follows.

I. The computing process of parity separation is as follows:

The coder adopts the two-description parity separation. If the signal is represented by S(k):

S(k), k=1, 2, 3, . . . N, where N is the number of the signals.

If the signal's two multiple-description algorithms are represented by $M_I(k_1)$ and $M_{II}(k_2)$:

Description 1: $M_I(k_1)$, $k_1$=1, 2, 3, . . . N/2, and
Description 2: $M_{II}(k_2)$, $k_2$=1, 2, 3, . . . N/2.

The algorithm and the result of multiple-description parity transformation are as follows:

When k is an odd number, namely, when k=1, 3, 5, . . . N−1, $M_{II}(k_1)$=R(k), where $k_1$=(k+1)/2; and when k is an even number, namely, when k=2, 4, 6 . . . N−1, $M_{II}(k_2)$=R(k), where $k_2$=k/2.

II. The computing process of dual transformation is as follows:

The coder adopts the two-description dual transformation algorithm. If the remaining signal is represented by S(k), S(k)=1, 2, 3, . . . N, where N is the number of the signals.

If the two multiple-description signals are represented by $M_I(k_1)$ and $M_{II}(k_2)$:

Description 1: $M_I(k_1)$, $k_1$=1, 2, 3, . . . N/2; and
Description 2: $M_{II}(k_2)$, $k_2$=1, 2, 3, . . . N/2.

The detailed algorithm is as follows:

(1): The coder initializes the cyclic variable k=1 and other parameters that need dual transformation.

(2): The coder pairs the signals to map the input variables A and B that need dual transformation:

A=S(k); and
B=S(k+1).

(3): The coder employs a multiple-description dual transformation for A and B to generate two output variables and $\overline{C}$ and $\overline{D}$, and then respectively maps the two output variables with two description signals:

$M_I(k_1)$=$\overline{C}$, where $k_1$=(k+1)/2, and
$M_{II}(k_2)$=$\overline{D}$, where $k_2$=(k+1)/2.

(4) Letting k=k+2, if k<N−1, step 2 is performed; if not, the dual transformation is ended.

In (3), the method for transforming signal A and signal B into variable $\overline{C}$ and $\overline{D}$ is as follows:

Definition:

Input matrix:

$$\begin{bmatrix} A \\ B \end{bmatrix};$$

Dual transform matrix:

$$T = \begin{bmatrix} a & b \\ c & d \end{bmatrix};$$

and

Dual transform output matrix:

$$\begin{bmatrix} C \\ D \end{bmatrix} = T \begin{bmatrix} A \\ B \end{bmatrix};$$

where, a, b, c, and d are the coefficients of the transform matrix, determining the redundancy introduced between two descriptions; A and B are input signals; and C and D are output signals.

The detailed algorithm for integer transformation is as follows:

$$\overline{A} = \left[\frac{A}{Q}\right], \overline{B} = \left[\frac{B}{Q}\right];$$

$$W = \overline{B} + \left[\frac{1+c}{d}\overline{A}\right];$$

and $$\overline{D} = [dW] - \overline{A};$$

$$\overline{C} = W - \left[\frac{1-b}{d}\overline{D}\right];$$

where Q represents a quantized step length, W represents an intermediate variable, and [ ] represents an operation for taking the integer value. $\overline{A}$ and $\overline{B}$ represent the integer variables of quantized A and B, $\overline{C}$ and $\overline{D}$ indicate two integer output variables.

III. The computing process of scalar quantization is as follows:

For the two-description scalar quantization, the signal input into scalar quantizer is the output description $M_I(k)$ of the parity separation or dual transformation, where k=1, 2, 3, . . . N, and N is the number of the remaining signals.

The scalar quantizer outputs two description signals:

Signal of Description 1: $M_1(k_1)$, $k_1$=1, 2, 3, . . . N; and
signal of Description 2: $M_2(k_2)$, $k_1$=1, 2, 3, . . . N.

The algorithm is detailed as follows:

Step 1: The cyclic variable k is initialized, letting k=1.

Step 2: The index is valuated. The integer input MI, the quantized result, and other indexes obtained otherwise, can serve as the index. After an index is obtained, searching the table for the matched index pair ($M_1(k_1)$ and $M_2(k_2)$). This index pair includes two description signals, which need to perform coding, where $k_1$=$k_2$=k.

Table 1 shows a list for two-description scalar quantization. If an index from step 2 equals to −16, the matched index pair is (−6, −5); if an index equals to 18, the matched index pair is (6, 6).

Step 3: k=k+1 is set; if k<N, step 2 is performed; if not, step 4 is performed.

Step 4: The two-description scalar quantization is ended.

TABLE 1

| | | Description 2: $M_2(k_2)$ | | | | | | | | | | | | |
|---|---|---|---|---|---|---|---|---|---|---|---|---|---|---|
| | ... | −6 | −5 | −4 | −3 | −2 | −1 | 0 | 1 | 2 | 3 | 4 | 5 | 6 ... |
| Description 1: $M_1(k_1)$ | ... | ⋱ | ⋮ | | | | | | | | | | | |
| | −6 | ... | −18 | −16 | | | | | | | | | | |
| | −5 | | −17 | −15 | −14 | | | | | | | | | |

TABLE 1-continued

| | | | | | | | Description 2: $M_2(k_2)$ | | | | | | | |
|---|---|---|---|---|---|---|---|---|---|---|---|---|---|---|
| | ... | −6 | −5 | −4 | −3 | −2 | −1 | 0 | 1 | 2 | 3 | 4 | 5 | 6 | ... |
| −4 | | | −13 | −12 | −10 | | | | | | | | | | |
| −3 | | | | −11 | −9 | −8 | | | | | | | | | |
| −2 | | | | | −7 | −6 | −4 | | | | | | | | |
| −1 | | | | | | −5 | −3 | −2 | | | | | | | |
| 0 | | | | | | | −1 | 0 | 2 | | | | | | |
| 1 | | | | | | | | 1 | 3 | 4 | | | | | |
| 2 | | | | | | | | | 5 | 6 | 8 | | | | |
| 3 | | | | | | | | | | 7 | 9 | 10 | | | |
| 4 | | | | | | | | | | | 11 | 12 | 14 | | |
| 5 | | | | | | | | | | | | 13 | 15 | 16 | |
| 6 | | | | | | | | | | | | | 17 | 18 | ... |
| ... | | | | | | | | | | | | | | ⋮ | ⋱ |

Example 2: The first multiple-description method is multiple-description scalar quantization; the second multiple-description method is multiple-description parity separation or dual transformation.

Figure 3:
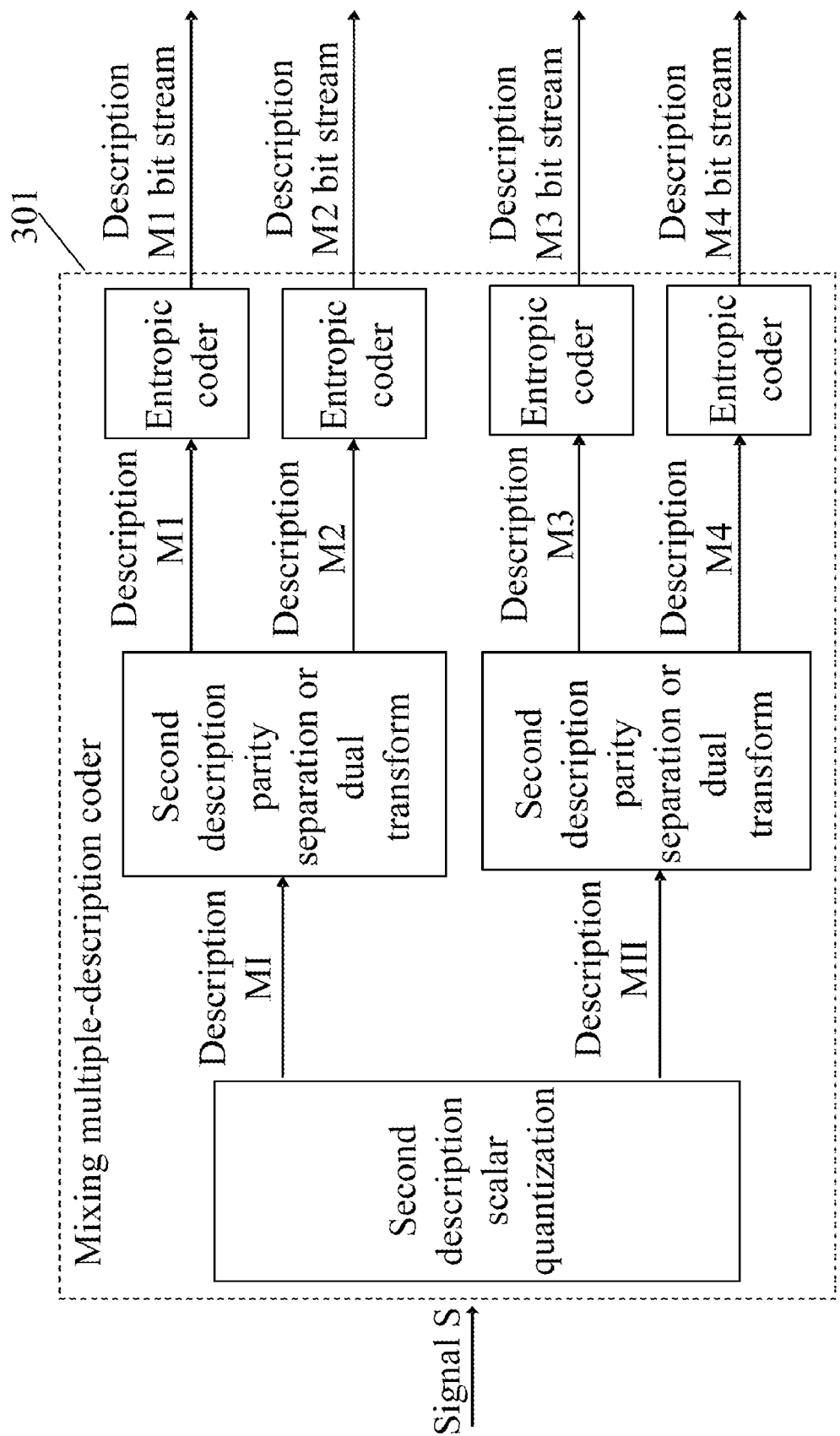
FIG. 3 is a flowchart in an embodiment of the present invention.

See FIG. 3. After coding signal S, a mixing multiple-description coder 301 performs the two-description parity separation or dual transformation of signal S to generate descriptions MI and MII, implements the two-description scalar quantization of descriptions MI and MII to generate descriptions M1, M2, M3 and M4, and then entropically codes the descriptions M1, M2, M3 and M4 through entropic coder, namely, Huffman code, to generate the bit streams of descriptions M1, M2, M3 and M4.

The detailed computing process of parity separation, dual transformation, and scalar quantization are omitted as they are the same with the ones in Example 1.

Figure 4:
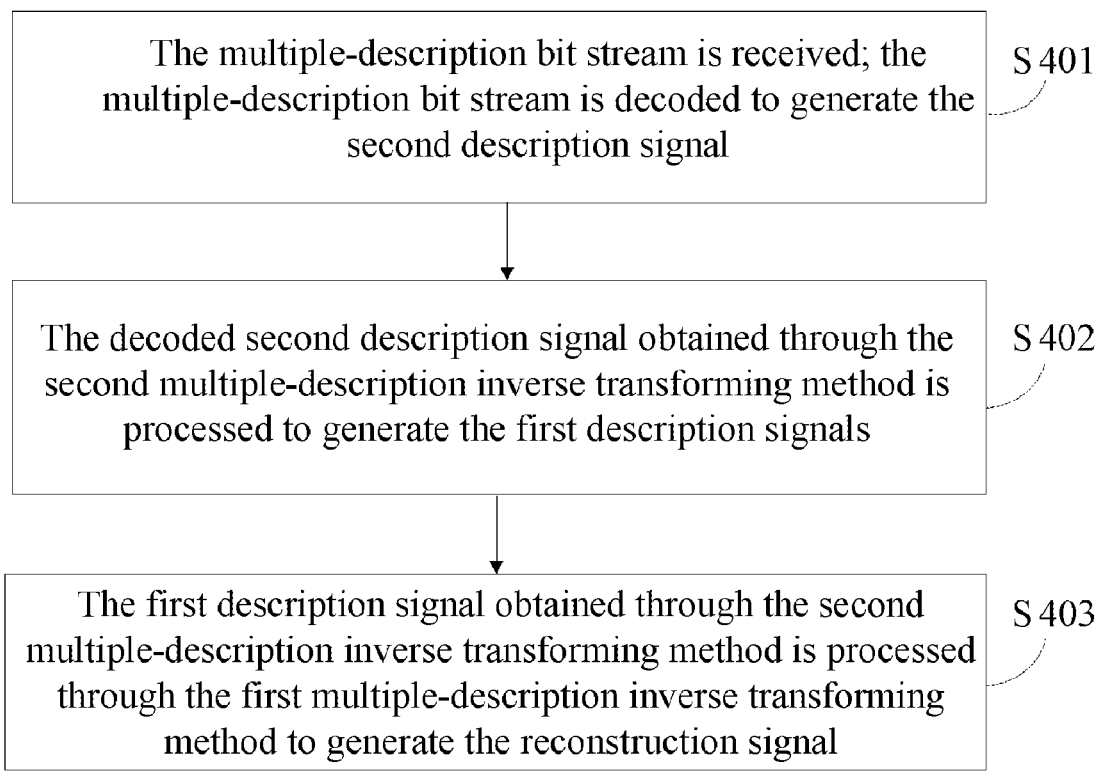
FIG. 4 is a flowchart in an embodiment of the present invention.

FIG. 4 is a flowchart in an embodiment of the present invention:

S401: A multiple-description bit stream is received, and decoded to generate the second description signal;

S402: The second description signal is processed through the second multiple-description inverse transformation method to generate the first description signal. S403: The first description signal is processed through the first multiple-description inverse transformation method to generate the reconstruction signal, where the signal is an audio signal, or a video signal, or a frequency domain parameter signal that has been converted into a frequency domain; and the decoding process for the multiple-description bit stream is to perform entropy decoding on the multiple-description bit stream.

The following examples illustrate an embodiment of the present invention.

Example 1

The first multiple-description inverse transformation method is multiple-description parity synthesis or multiple-description inverse dual transformation. The second multiple-description inverse transformation method is multiple-description scalar quantization.

Figure 5:
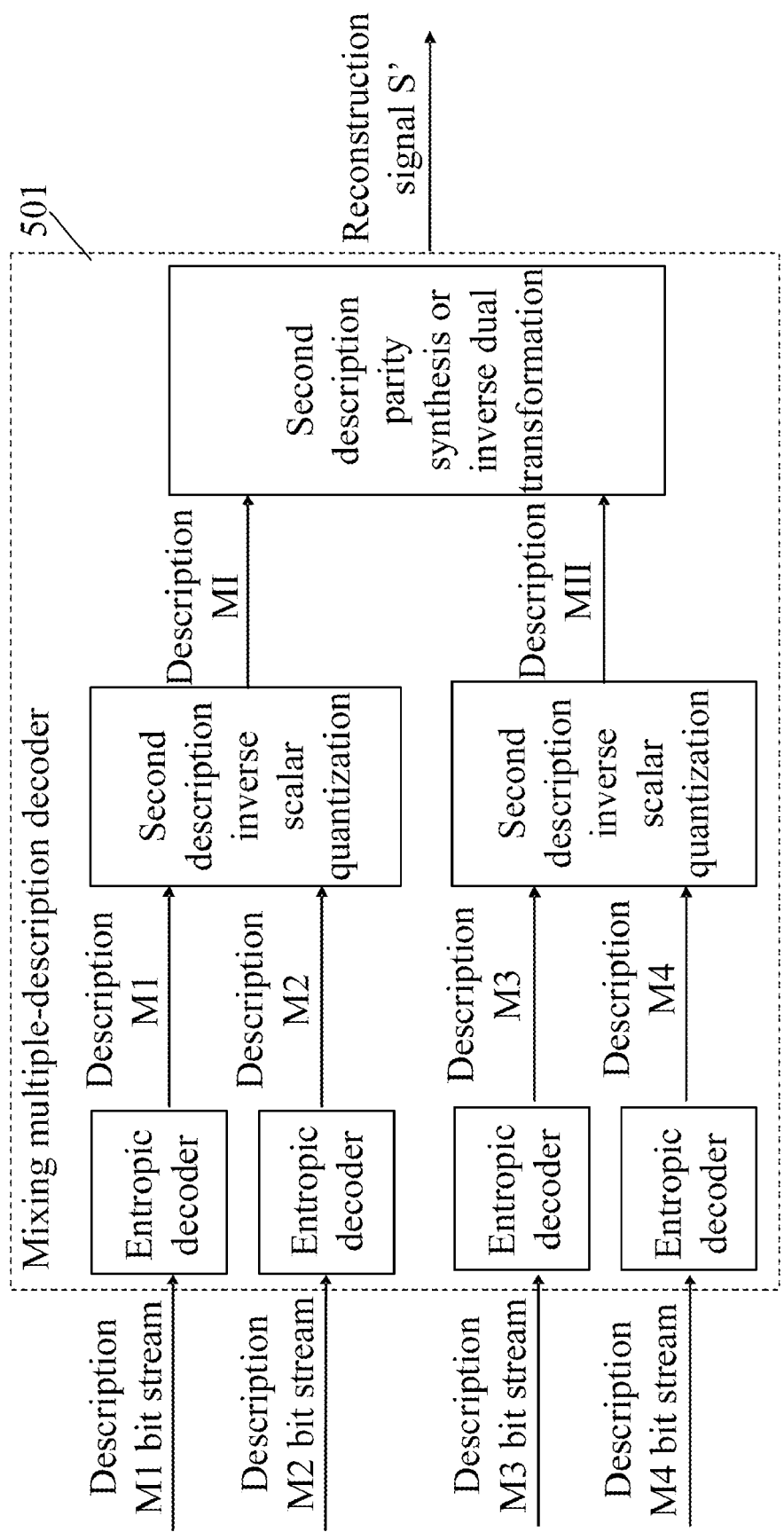
FIG. 5 is a flowchart in an embodiment of the present invention.

See FIG. 5. A mixing multiple-description decoder 501 decodes the bit streams of descriptions M1, M2, M3 and M4, which are transmitted through network. The mixing multiple-description decoder 501 delivers the bit streams of descriptions M1, M2, M3 and M4 to the entropic decoder to implement entropic decoding to generate descriptions M1, M2, M3 and M4, inversely quantizes the scalars of descriptions M1, M2, M3 and M4 to generate descriptions MI and MII, and then performs parity synthesis or inverse dual transformation on descriptions MI and MII to generate reconstruction S'.

The detailed computing process of parity synthesis, inverse dual transformation, and inverse scalar quantization are as follows:

(a). The computing process of inverse scalar quantization is as follows:

On the decoder, when both descriptions M1 and M2 are lost, the inverse quantizer of the two-description scalar stops outputting description MI. After receiving all or one of the descriptions, the inverse quantizer outputs the description MI. While removing description M1 or M2, the description MI that is output by inverse quantizer of two-description scalar has certain amplitude loss. The inverse quantization processes of descriptions M3 and M4 are similar. If description MI and MII have no output and descriptions M1, M2, M3 and M4 are lost, no reconstruction signal S' will be output. When MI and MII are partly output or not output at all, a reconstruction signal S' is obtained by synthesizing the two-description parity or inversely transforming the dual. However, if MI has no output or descriptions M1 and M2 are lost, or MII has no output or descriptions M3 and M4 are lost, the resolutions of frequency or lost time has certain loss. Generally, those losses, namely, the lost amplitude or resolution, are distributed to different parts by adopting this mixing multiple-description method when multi-packet loss takes place, to increase the acoustics quality.

(b). The computing process of parity synthesis is as follows:

For two-description parity synthesis, if descriptions $M_I$ and $M_{II}$ are received on the decoder, the synthesis algorithms is as follows:

Letting $S'(k)=M_I(k_1)$, where $k_1=(k+1)/2$, when k is an odd number, namely, when k=1, 3, 5, ... N−1; and letting $S'(k)=M_{II}(k_2)$, where $k_2=k/2$, when k is an even number, namely, when k=2, 4, 6 ... N.

If description $M_I$ is received, the synthesis algorithms is as follows:

Letting S'(k)=MI(k1), where k1=(k+1)/2, when k is an odd number, namely, when k=1, 3, 5, ... N−1; and letting S'R(k)=0, where $k_2$=k/2, when k is an even number, namely, when k=2, 4, 6 ... N.

If description $M_{II}$ is received, the synthesis algorithms is as follows:

Letting S'(k)=0, where k1=(k+1)/2, when k is an odd number, namely, when k=1, 3, 5, ... N−1; and letting S'(k)=MII(k2), where k2=k/2, when k is an even number, namely, when k=2, 4, 6 ... N.

(c). The computing process of inverse dual transformation is as follows:

On the decoder, a decoder adopts different decoding algorithms according to the number of received descriptions. The detailed algorithm is as follows:

Step 1: The cyclic variable k=1 and other parameters that need dual transformation is initialized by the decoder.

Step 2: The description is processed according to the number of received descriptions:

(1) Mapping the two descriptions and two inputs of transform matrix if descriptions $M_I$ and $M_{II}$ are received:

$\overline{C}=M_I(k_1)$, where, k1=(k+1)/2, and
$\overline{D}=MII(k2)$, where, k2=(k+1)/2.

Inversely transforming the duals, namely, $\overline{C}$ and $\overline{D}$, to generate $\hat{A}$ and $\hat{B}$, and then assigning the two output values to corresponding reconstruction signals:

S'(k)=$\hat{A}$, and
S'(k+1)=$\hat{B}$, where the computing process of "inverse dual transformation (center) decoder 0" is as follows:

$$W = \overline{C} + \left[\frac{1-b}{d}\overline{D}\right];$$

$$\overline{A} = [dW] - \overline{D};$$

and $$\overline{B} = W - \left[\frac{1+c}{d}\overline{A}\right];$$

$$\hat{A} = \overline{A}Q, \hat{B} = \overline{B}Q;$$

where, Q represents a quantized step length, W indicates an intermediate variable, $\hat{A}$ and $\hat{B}$ stand for the inversely quantized values of $\overline{A}$ and $\overline{B}$, and the sign '[ ]' signifies an operation for taking an integer value.

(2) Mapping the description and one input of transform matrix if description $M_I$ is received:

$\overline{C}=M_I(k_1)$, where, $k_1$=(k+1)/2,

Inversely transforming the duals, namely, $\overline{C}$, to generate $\hat{A}$ and $\hat{B}$, and then assigning these two output values to corresponding reconstruction signals:

S'(k)=$\hat{A}$, and
S'(k+1)=$\hat{B}$ where the computing process of inverse dual transformation is as follows:

Predicting a lost signal $\overline{D}$:

$$\tilde{C} = \overline{C}Q; \hat{D} = \frac{\sigma_c * \sigma_d}{\sigma_c^2 + \sigma_q^2} * \tilde{C} * \cos\phi.$$

Inversely transforming $\tilde{C}$ and $\hat{D}$:

$$\begin{bmatrix}\hat{A}\\\hat{B}\end{bmatrix} = T^{-1}\begin{bmatrix}\tilde{C}\\\hat{D}\end{bmatrix}$$

where: $\sigma_c$, $\sigma_d$ and $\sigma_q$ signify the standard deviations of variable C, variable D and quantized error; $\tilde{C}$ is an inversely quantized value of $\overline{C}$ by the decoder; $\hat{D}$ is the restored value of $\tilde{C}$ by the decoder; matrix $T^{-1}$ is an inverse matrix of matrix T; $\hat{A}$ and $\hat{B}$ are two reconstructed values by the decoder; cos φ is a coefficient of correlation between variable C and variable D.

(3) Mapping the description and one input of transform matrix if description $M_{II}$ is received:

$\overline{D}=M_I(k_2)$, where $k_2$=(k+1)/2.

Inversely transforming the dual, namely, $\overline{D}$, to generate $\hat{A}$ and $\hat{B}$, and then assigning the two output values to the corresponding reconstruction signals:

S'(k)=$\hat{A}$, and
S'(k+1)=$\hat{B}$.

The detailed algorithm is as follows:
Predicting a lost signal $\overline{C}$ by decoder:

$$\tilde{D} = \overline{D}Q;$$

$$\hat{C} = \frac{\sigma_c * \sigma_d}{\sigma_d^2 + \sigma_q^2} * \tilde{D} * \cos\phi$$

Inversely transforming $\hat{C}$ and $\tilde{D}$:

$$\begin{bmatrix}\hat{A}\\\hat{B}\end{bmatrix} = T^{-1}\begin{bmatrix}\hat{C}\\\tilde{D}\end{bmatrix}$$

where: $\sigma_c$, $\sigma_d$ and $\sigma_q$ signify the standard deviations of variables C and D and quantized error; $\tilde{D}$ is an inversely quantized value of $\overline{D}$ by the decoder; $\hat{C}$ is a restored value of $\tilde{D}$ by the decoder; matrix $T^{-1}$ is an inverse matrix of matrix T; $\hat{A}$ and $\hat{B}$ are the reconstructed values by the decoder; cos φ is a coefficient of correlation between variable C and variable D; C and D multiplied by matrix T through input signals A and B equal to $$\begin{bmatrix}C\\D\end{bmatrix} = T\begin{bmatrix}A\\B\end{bmatrix};$$

$\overline{C}$ and $\overline{D}$ are obtained by rounding the numbers of the quantized A and B.

Step 3: k=k+2 is set; if k<N−1, step 2 is performed; if not, step 4 is performed.

Step 4: The process is ended.

Thus, the multiple-description decoder reconstructs the signals.

On the decoder, the decoder adopts different decoding algorithms according to the number of received descriptions. The detailed algorithm is as follows:

Step 1: The cyclic variable k is initialized, letting k=1.

Step 2: The received bit stream is processed according to the different conditions:

(1) Searching a corresponding MI value from TABLE 1 if descriptions $M_1(k_1)$ and $M_2(k_2)$ are received;

(2) searching a value from the corresponding row on TABLE 1 and letting the one with the smallest absolute value be the MI value if description $M_1(k_1)$ is received; and (3) searching the value from the corresponding row on TABLE 1 and letting the one with the smallest absolute value be the MI residual error value if description $M_2(k_2)$ is received;

where $k_1$=$k_2$=k.

Step 3: k=k+1 is set; if k<N, step 2 is performed; if not, step 4 is performed.

Step 4: The process is ended.

Thus, the multiple-description decoder reconstructs a residual error signal, namely, a reconstruction signal.

Example 2

The first multiple-description inverse transformation method is a multiple-description inverse scalar quantization. The second multiple-description inverse transformation method is a multiple-description parity synthesis or multiple-description inverse dual transformation.

Figure 6:
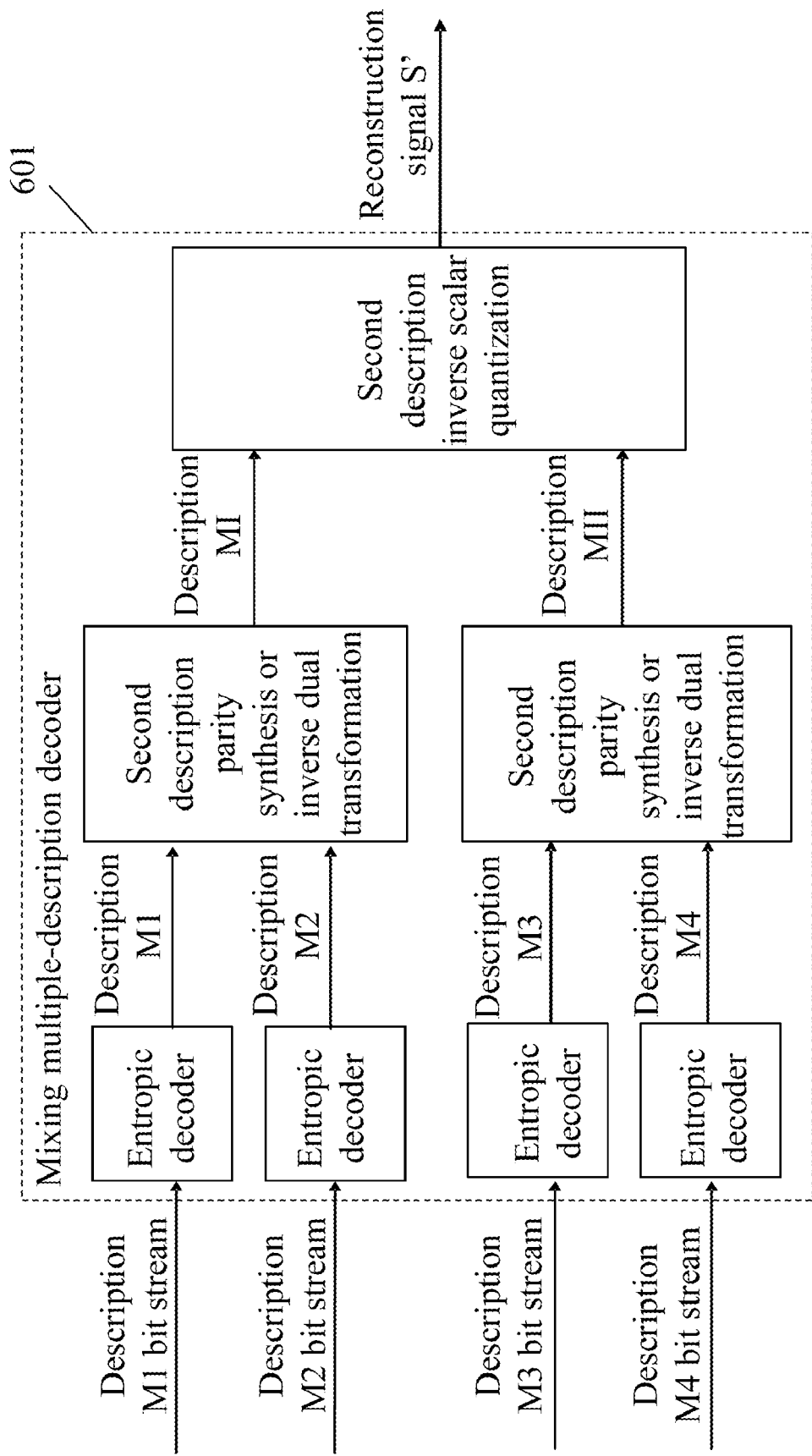
FIG. 6 is a flowchart in an embodiment of the present invention.

See FIG. 6. A mixing multiple-description decoder 601 decodes the bit streams of descriptions M1, M2, M3 and M4, which are transferred from a transmission network. The mixing multiple-description decoder 601 delivers the bit streams of descriptions M1, M2, M3 and M4 to an entropic decoder to complete entropic decoding to generate descriptions M1, M2, M3 and M4, then synthesizes the parities or inversely transforms the duals of descriptions M1, M2, M3 and M4 to generate descriptions MI and MII, and then performs scalar quantization on descriptions MI and MII to generate reconstruction S'.

The detailed computing processes of parity synthesis, inverse dual transformation, and inverse scalar quantization are omitted as they are the same with Example 1.

The prior solution indicates that the coder processes the received signal by two multiple-description methods, while the decoder and receiver process the received signal by two multiple-description inverse transformation methods. Therefore, the coder and decoder simplify MDC and MDD through inverse processes. Because the voice quality deteriorations brought out by different multiple-description algorithms are distributed to different parts when packet loss takes place, user experience is greatly improved.

Figure 7:
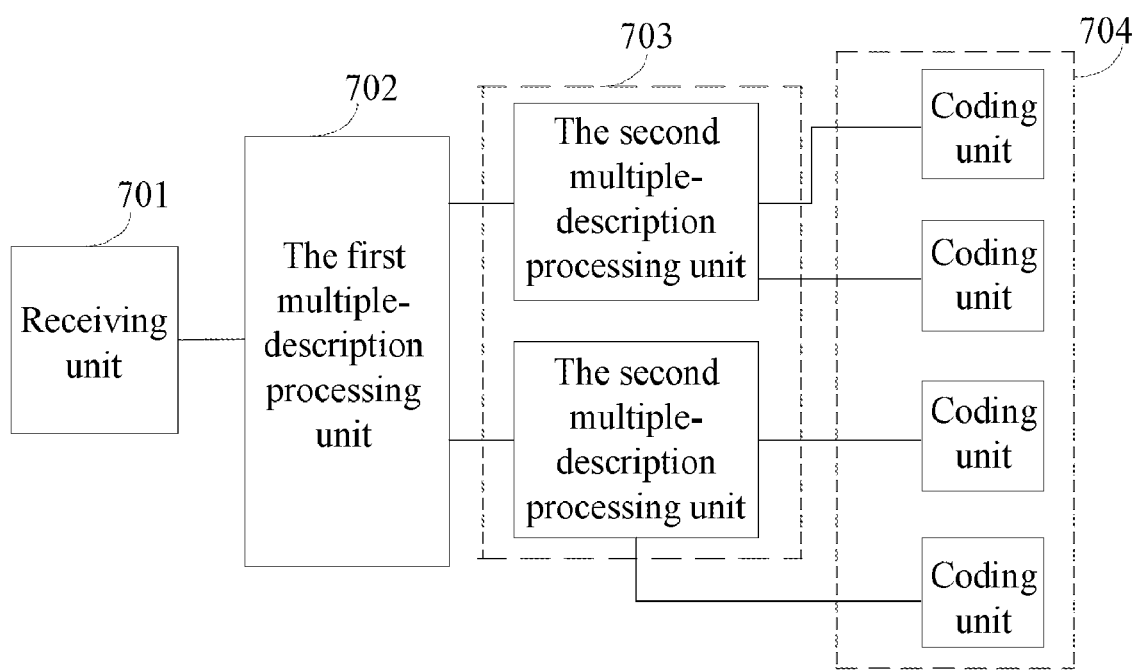
FIG. 7 shows the apparatus in an embodiment of the present invention.

The previous flowcharts are illustrated in an embodiment of the present invention. The schematic drawings for apparatus system are described as follows:

FIG. 7 shows the apparatus in an embodiment of the present invention, including:

a receiving unit 701, adapted to: receive a signal, where the received signal is an audio signal, or a video signal, or a frequency domain parameter signal that is converted into a frequency domain;

a first multiple-description processing unit 702, adapted to: process the received signal obtained by the receiving unit 701 through the first multiple-description method to generate at least two first description signals;

a second multiple-description processing unit 703, adapted to: process at least one of the first description signals through the second multiple-description method to generate at least two second description signals; and a coding unit 704, adapted to: code the second description signal to generate a multiple-description bit stream.

Specifically, the second multiple-description processing unit 702 is:

a multiple-description parity separating unit, adapted to: perform multiple-description parity separation on the received signal to generate at least two first description signals; or a multiple-description dual transformation unit, adapted to: perform multi-description dual transformation on the received signal to generate at least two first description signals.

Correspondingly, the second multiple-description processing unit 703 is a multiple-description parity quantizing unit, adapted to: perform multiple-description scalar quantization on at least one of the first description signals to generate at least two second description signals.

The first multiple-description processing unit 702 is a multiple-description parity quantizing unit, adapted to: perform multiple-description scalar quantization on the received signal to generate at least two first description signals.

Correspondingly, the second multiple-description processing unit 703 is:

a multiple-description parity separating unit, adapted to: perform multiple-description parity separation on at least one of the first description signals to generate at least at least two second description signals; or a multiple-description dual transformation unit, adapted to: perform multi-description dual transformation on at least one of the first description signals to generate at least two second description signals.

The coding unit 704 is an entropic coding unit, adapted to entropically code the second description signal to generate the multiple-description bit stream.

Figure 8:
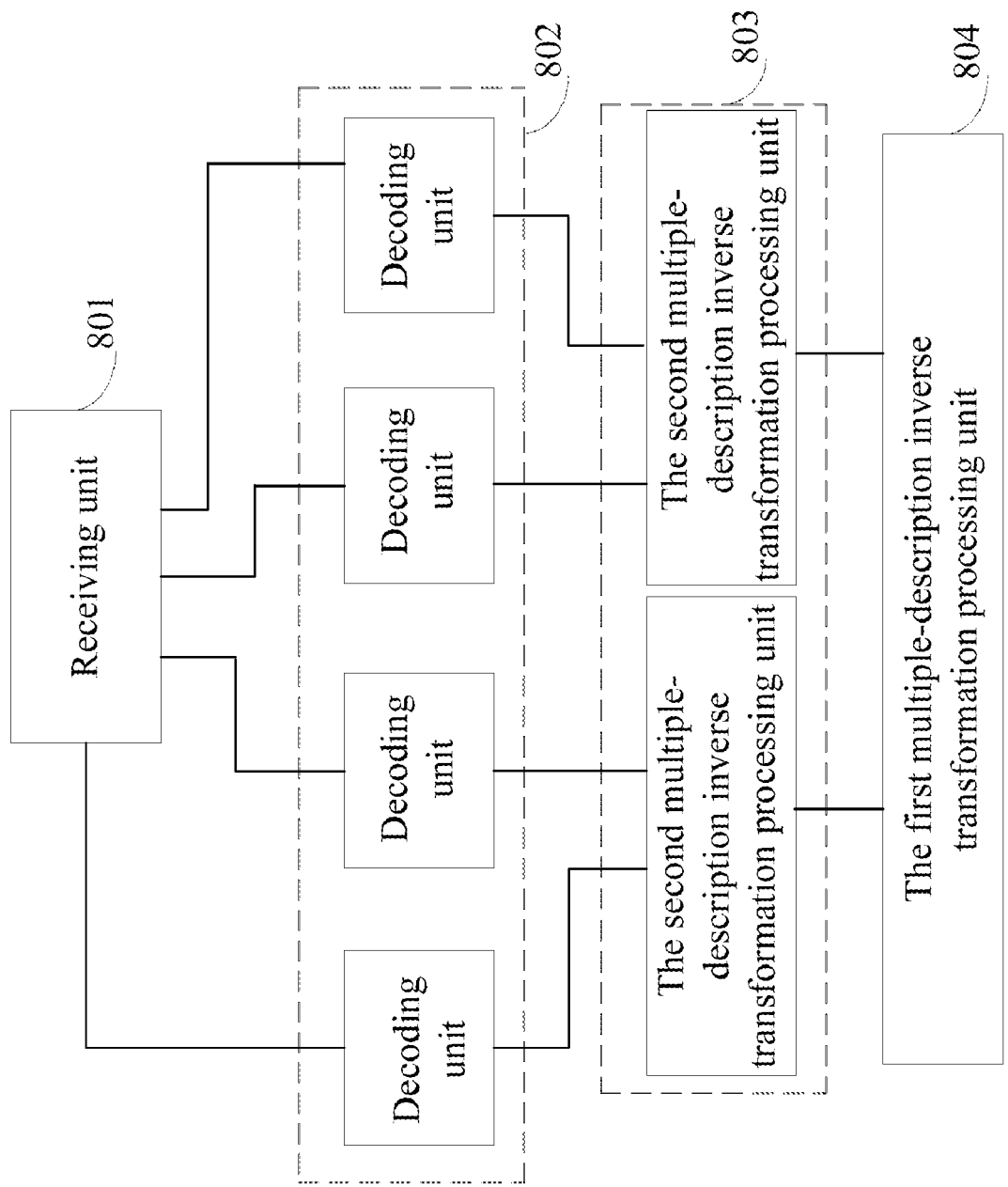
FIG. 8 shows the apparatus in an embodiment of the present invention.

FIG. 8 shows the apparatus in an embodiment of the present invention, comprising:

a receiving unit 801, adapted to: receive the multiple-description bit stream;

a decoding unit 802, adapted to: decode the multiple-description bit stream obtained by receiving unit 801 to generate the second description signal;

a second multiple-description inverse transformation processing unit 803, adapted to: process the decoded second description signal through the second multiple-description inverse transformation method to generate the first description signal; and a first multiple-description inverse transformation processing unit 804, adapted to: process the first description signal through the first multiple-description inverse transformation method to generate a reconstruction signal.

The second multiple-description inverse transformation processing unit 803 is a multiple-description inverse scalar quantizing unit, adapted to: perform multiple-description inverse scalar quantization on the second description signal to generate the first description signal.

Correspondingly, the first multiple-description inverse transformation processing unit 804 is:

a multiple-description parity synthesizing unit, adapted to: perform multiple-description parity synthesis on the first description signal to generate the reconstruction signal; or a multiple-description inverse dual transformation unit, adapted to: perform multi-description inverse dual transformation on the first description signal to generate a reconstruction signal.

The second multiple-description inverse transformation processing unit 803 is:

a multiple-description parity synthesizing unit, adapted to: perform multiple-description parity synthesis on the second description signal to generate the first description signal; or a multiple-description inverse dual transformation unit, adapted to: perform multi-description inverse dual transformation on the second description signal to generate the first description signal.

The first multiple-description inverse transformation processing unit 804 is a multiple-description inverse scalar quantizing unit, adapted to: perform multiple-description inverse scalar quantization on the first description signal to generate the reconstruction signal.

The decoding unit 802 is an entropic decoding unit, adapted to: entropically decode the multiple-description bit stream to generate the second description signal.

Figure 9:
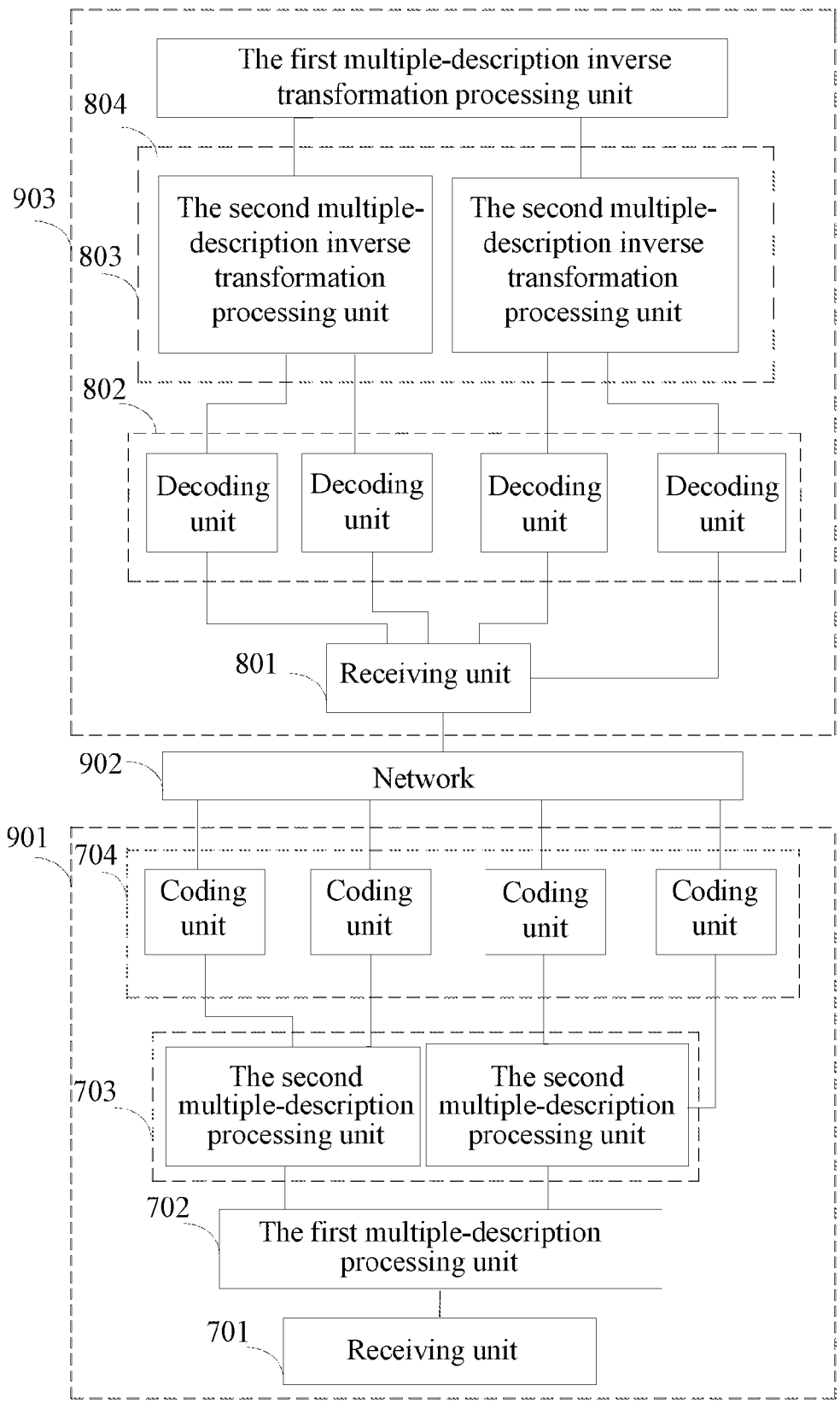
FIG. 9 shows the system in an embodiment of the present invention.

FIG. 9 shows the system in an embodiment of the present invention, comprising:

a coder 901, adapted to: process the received signal according to the first multiple-description method to generate at least two first description signals; process at least one of the first description signals through the second multiple-description method to generate at least two second description signals; code the second description signal to generate the multiple-description bit stream; and deliver the multiple-description bit stream; and a decoder 903, adapted to: receive the multiple-description bit stream from a network 902; decode the multiple-description bit stream; process the decoded description signal through the second multiple-description inverse transformation method; and process the result obtained through the second multiple-description inverse transformation method by using the first multiple-description inverse transformation method to generate the reconstruction signal.

The coder 901 includes:

a receiving unit 701, adapted to: receive a signal, where the received signal is an audio signal, or a video signal, or a frequency domain parameter signal that has been converted into a frequency domain;

a first multiple-description processing unit 702, adapted to: process the received signal obtained by the receiving unit 701 through the first multiple-description method to generate at least two first description signals;

a second multiple-description processing unit 703, adapted to: process at least one of the first description signals through the second multiple-description method to generate at least two second description signals; and a coding unit 704, adapted to: code the second description signal to generate the multiple-description bit stream.

Specifically, the second multiple-description processing unit 702 is:

a multiple-description parity separating unit, adapted to: perform multiple-description parity separation on the received signal to generate at least two first description signals; or a multiple-description dual transformation unit, adapted to: perform multi-description dual transformation on the received signal to generate at least two first description signals.

Correspondingly, the second multiple-description processing unit 703 is a multiple-description parity quantizing unit, adapted to: perform multiple-description scalar quantization on at least one of the first description signals to generate at least two second description signals.

The first multiple-description processing unit 702 is a multiple-description parity quantizing unit, adapted to: perform multiple-description scalar quantization on the received signal to generate at least two first description signals.

Correspondingly, the second multiple-description processing unit 703 is:

a multiple-description parity separating unit, adapted to: perform multiple-description parity separation on at least one of the first description signals to generate at least at least two second description signals; or a multiple-description dual transformation unit, adapted to: perform multi-description dual transformation on the first description signal to generate at least two second description signals.

The coding unit 704 is an entropic coding unit, adapted to: entropically code the second description signal to generate multiple-description bit stream.

The decoder 903 includes:

a decoding unit 802, adapted to: decode the multiple-description bit stream obtained by receiving unit 801 to generate the second description signal;

a second multiple-description inverse transformation processing unit 803, adapted to: process the decoded second description signal through the second multiple-description inverse transformation method to generate the first description signal; and a first multiple-description inverse transformation processing unit 804, adapted to: process the first description signal through the first multiple-description inverse transformation method to generate the reconstruction signal.

The second multiple-description inverse transformation processing unit 803 is a multiple-description inverse scalar quantizing unit, adapted to: perform multiple-description scalar quantization on the second description signal to generate the first description signal.

Correspondingly, the first multiple-description inverse transformation processing unit 804 is:

a multiple-description parity synthesizing unit, adapted to: perform multiple-description parity synthesis on the first description signal to generate the reconstruction signal; or a multiple-description inverse dual transformation unit, adapted to: perform multi-description inverse dual transformation on the first description signal to generate a reconstruction signal.

Specifically, the second multiple-description inverse transformation processing unit 803 is:

a multiple-description parity synthesizing unit, adapted to: perform multiple-description parity synthesis on the second description signal to generate the first description signal; or a multiple-description inverse dual transformation unit, adapted to: perform multi-description inverse dual transformation on the second description signal to generate the first description signal.

The first multiple-description inverse transformation processing unit 804 is a multiple-description inverse scalar quantizing unit, adapted to: perform multiple-description inverse scalar quantization on the first description signal to generate the reconstruction signal.

The decoding unit 802 is an entropic decoding unit, adapted to entropically decode the multiple-description bit stream to generate the second description unit.

The network 902 is an IP network or wireless network.

The prior solution indicates that the coder processes the received signal through two multiple-description methods, while the decoder and receiver process the received signal through two multiple-description inverse transformation methods. Therefore, the coder and decoder simplify MDD through inverse processes. Because the voice quality deteriorations brought out through different multiple-description algorithms are distributed to different parts when packet loss takes place, user experience is greatly improved.

A computer program product is provided in an embodiment of the present invention. The computer program product comprises codes for computer programs. When the code is executed by a computer, it allows the computer to perform any step of the MDC method.

A readable memory medium for a computer is provided in an embodiment of the present invention. The readable memory medium for the computer stores codes for computer programs. When the code is executed by a computer, the code allows the computer to perform any step of the MDC method.

A computer program product is provided in an embodiment of the present invention. The computer program product comprises codes for computer programs. When the code is executed by a computer, it allows the computer to perform any step of the MDD method.

A readable memory medium for a computer is provided in an embodiment of the present invention. The readable memory medium for the computer stores codes for computer programs. When the code is executed by a computer, it allows the computer to perform any step of the MDD method.

It is understandable for those skilled in the art that all or part of the steps in the forgoing embodiments may be performed through hardware instructed by a program. The program may be stored in a computer-readable storage medium.

The forgoing storage medium can be a ROM, a magnetic disk or a compact disk.

The method, apparatus and system for multiple-description coding and decoding is provided in an embodiment of the present invention. This application illustrates specific examples involving the principles and implementations of the present invention to facilitate the understanding of methods and core ideas of the present invention. Meanwhile, those skilled in the art may make various modifications and variations to the implementation methods and application areas according to the ideas of the present invention. Therefore, the content of this specification shall not be construed to have confined the scope of the present invention.

What is claimed is:

1. A multiple-description decoding method, comprising:
   receiving, by a hardware decoder, multiple-description bit streams, and decoding, by the hardware decoder, the multiple-description bit streams to generate a second description signal;
   processing, by the hardware decoder, the second description signal through a second multiple-description inverse transformation method to generate a first description signal; and
   processing, by the hardware decoder, the first description signal through a first multiple-description inverse transformation method to generate a reconstruction signal;
   wherein the first multiple-description inverse transformation method includes a multiple-description parity synthesis or a multiple-description inverse dual transformation, and the second multiple-description inverse transformation method includes a multiple-description inverse scalar quantization; or
   wherein the first multiple-description inverse transformation method includes a multiple-description inverse scalar quantization, and the second multiple-description inverse transformation method includes a multiple-description parity synthesis or a multiple-description inverse dual transformation.

2. A multiple-description decoding (MDD) apparatus, comprising:
   a receiving unit, configured to: receive multiple-description bit streams;
   a decoding unit, configured to: decode the multiple-description bit streams to generate second description signals;
   a second multiple-description inverse transformation processing unit, configured to: process the second description signal through a second multiple-description inverse transformation method to generate first description signals; and
   a first multiple-description inverse transformation processing unit, configured to: process the first description signal through a first multiple-description inverse transformation method to generate reconstruction signals;
   wherein the second multiple-description processing unit includes a multiple-description inverse scalar quantizing unit configured to perform multiple-description inverse scalar quantization on the second description signal to generate the first description signal, and the first multiple-description inverse transformation processing unit includes a multiple-description parity synthesizing unit configured to perform multiple-description parity synthesis on the first description signal to generate the reconstruction signal or a multiple-description inverse dual transformation unit configured to perform multi-description inverse dual transformation on the first description signal to generate the reconstruction signal; or
   wherein the second multiple-description inverse transformation processing unit includes a multiple-description parity synthesizing unit configured to perform multiple-description parity synthesis on the second description signal to generate the first description signal or a multiple-description inverse dual transformation unit configured to perform multi-description inverse dual transformation on the second description signal to generate the first description signal, and the first multiple-description inverse transformation processing unit includes a multiple-description inverse scalar quantizing unit configured to perform multiple-description inverse scalar quantization on the first description signal to generate the reconstruction signal.

3. The apparatus according to claim 2, wherein the decoding unit includes an entropic decoding unit, which is configured to: entropically decode the multiple-description bit stream to generate the second description signal.

4. A multiple-description coding (MDC) and multiple-description decoding (MDD) system, comprising a hardware encoder and a hardware decoder, wherein:
   the hardware encoder is configured to: process a received signal according to a first multiple-description method to generate at least two first description signals, process at least one of the first description signals through a second multiple-description method to generate at least two second description signals, encode the second description signal to generate a multiple-description bit stream, and deliver the multiple-description bit stream; and
   the hardware decoder further comprises:
   a receiving unit configured to receive the multiple-description bit stream;
   a decoding unit configured to decode the multiple-description bit stream to generate second description signals;
   a second multiple-description inverse transformation processing unit configured to process the second description signals through a second multiple-description inverse transformation method to generate first description signals; and
   a first multiple-description inverse transformation processing unit configured to process the first description signals through a first multiple-description inverse transformation method to generate reconstruction signals;
   wherein the second multiple-description processing unit includes a multiple-description inverse scalar quantizing unit configured to perform multiple-description inverse scalar quantization on the second description signal to generate the first description signal, and the first multiple-description inverse transformation processing unit includes a multiple-description parity synthesizing unit configured to perform multiple-description parity synthesis on the first description signal to generate the reconstruction signal or a multiple-description inverse dual transformation unit configured to perform multi-description inverse dual transformation on the first description signal to generate the reconstruction signal; or wherein the second multiple-description inverse transformation processing unit includes a multiple-description parity synthesizing unit configured to perform multiple-description parity synthesis on the second description signal to generate the first description signal or a multiple-description inverse dual transformation unit configured to perform multi-description inverse dual transformation on the second description signal to generate the first description signal, and the first multiple-description inverse transformation processing unit includes a multiple-description inverse scalar quantizing unit configured to perform multiple-description inverse scalar quantization on the first description signal to generate the reconstruction signal.

* * * * *